(12) United States Patent
Nishimiya

(10) Patent No.: US 7,277,969 B2
(45) Date of Patent: *Oct. 2, 2007

(54) BUS SYSTEM DESIGN METHOD, BUS SYSTEM, AND DEVICE UNIT

(75) Inventor: Ryohei Nishimiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/317,011

(22) Filed: Dec. 27, 2005

(65) Prior Publication Data

US 2006/0149867 A1    Jul. 6, 2006

Related U.S. Application Data

(63) Continuation of application No. PCT/JP2004/011837, filed on Aug. 18, 2004.

(30) Foreign Application Priority Data

Aug. 19, 2003  (JP) .............................. 2003-294845

(51) Int. Cl.
   *G06F 3/00* (2006.01)
   *G06F 5/00* (2006.01)
(52) U.S. Cl. .................. 710/58; 710/301; 710/302; 710/303; 710/304; 713/501; 713/502; 713/503; 713/600
(58) Field of Classification Search ............... 710/58, 710/301–304; 713/500–503, 600
   See application file for complete search history.

(56) References Cited

U.S. PATENT DOCUMENTS 5,787,261 A * 7/1998 Osaka et al. ............... 710/302
6,078,980 A * 6/2000 Holland et al. ............. 713/400
6,519,669 B1   2/2003 Yanagisawa ................ 710/304

FOREIGN PATENT DOCUMENTS

| JP | 61-196353   | 8/1986  |
|----|-------------|---------|
| JP | 3-259315    | 11/1991 |
| JP | 4-186411    | 7/1992  |
| JP | 7-98675     | 4/1995  |
| JP | 7-253834    | 10/1995 |
| JP | 9-44280     | 2/1997  |
| JP | 11-232211   | 8/1999  |
| JP | 2000-122760 | 4/2000  |
| JP | 2000-298640 | 10/2000 |
| JP | 2002-140288 | 5/2002  |
| JP | 2002-244994 | 8/2002  |

* cited by examiner

*Primary Examiner*—Donald Sparks
*Assistant Examiner*—Chun-Kuan (Mike) Lee
(74) *Attorney, Agent, or Firm*—Staas & Halsey LLP

(57) ABSTRACT

On the basis of a period of a timing signal, a signal propagation delay in a device unit, signal propagation delay in the timing signal bus and the data bus, and a setup time of another device unit or a device connected to the data bus, a timing at which noise caused by active connection of the first device to the data bus is propagated to the other device unit or the device is computed in a step of noise propagation computing, and on the basis of the timing computed in the step of noise propagation computing, a connection timing at which the first device unit is connected to the data bus. With thes two steps, a noise caused by active connection of a device unit does not affect other device units and devices connected to the same data bus.

13 Claims, 4 Drawing Sheets

FIG. 3A BASE CLOCK

FIG. 3B INPUT CLOCK TO BUS SWITCH CONTROLLER

FIG. 3C BUS SWITCH CONNECTION INSTRUCTION OUTPUT

FIG. 3D BUS SWITCH ENABLED

FIG. 3E NOISE OCCURRENCE

FIG. 3F NOISE PROPAGATION

FIG. 3G INPUT CLOCK TO ANOTHER DEVICE UNIT

BUS SYSTEM DESIGN METHOD, BUS SYSTEM, AND DEVICE UNIT

This application is a continuation application, filed under 35 USC 111(a), of International Application PCT/JP2004/11837, filed Aug. 18, 2004.

BACKGROUND OF THE INVENTION (1) Field of the Invention

The present invention relates to a bus system in which a plurality of device units are connectible to the same bus, exemplified by a peripheral component interconnect (PCI) bus system employed in a storage system.

The invention also relates to a bus system design method suitable for designing the above bus system, and a device unit connectable to the bus system being in an active state.

(2) Description of Related Art

For example, a storage system which is equipped with a number of disk units (magnetic disk units, physical device units) and which is used for writing data from a server (host) to these disk units in response to access from the server or reading data requested by the server from the disk units and transmitting the data includes a host interface module, which controls interface (data transfer) with the server via a fiber channel interface bus.

The host interface module is connected to a PCI bridge module through an interface bus such as a PCI bus and transmits data to a disk interface module, management module, etc., connected to the PCI module through the PCI bus.

The host interface module is constructed as a single unit by mounting a central processing unit (CPU), a memory, and other devices on a printed-circuit board. If the thus-constructed host interface module is fitted or inserted in a mother board having a PCI bus, the device constituting the host interface module is communicably connected to the PCI bus. Installing a requisite number of interface modules to the mother board can easily fabricate a storage system equipped with the requisite number of host interface modules.

Mounting the host interface module on the PCI bus of the mother board being active (in a current-carrying state) (active insertion, active connection) generates a noise and has an adverse influence on the operation of other host interface modules connected on the PCI bus and operation of various devices constituting the mother board. This noise may be a cause of errors that occur in the above operations.

To prevent the adverse influence due to active insertion of host interface modules, operation of the PCI bus is generally stopped when a host interface module is fitted. For example, Japanese Laid-Open Patent Publication No. HEI 7-253834 (the below Patent Reference 1) discloses a module insertion/removal control device that inhibits noise propagating by connecting or disconnecting some of switches during active connection and disconnection, to prevent modules from failing or operating incorrectly.

However, if the bus operation of the PCI bus is stopped in order to insert a host interface module (i.e., the PCI bus is made non-active), data transmission through the PCI bus cannot be performed during the stoppage and therefore the data transmission efficiency is reduced. Also, since monitoring whether or not a host interface module has been inserted in the PCI bus and a variety of operations for stopping the PCI bus are needed, system control becomes complicated and system design efficiency is reduced.

Furthermore, addition of a dedicated control device for active insertion/removal (active connection) raise manufacturing costs and increases device size.

With the foregoing problems in view, the object of the present invention is to provide a bus system, a device unit, and a design method for the bus system, in each of which active connection of a device unit dose not affect other device units and devices that are connected to the same data bus.

Patent Reference 1: Japanese Laid-Open Patent Publication No. HEI 7-253834 (pages 3-4 FIGS. 1. 2.)

SUMMARY OF THE INVENTION

To attain the above object, as a first generic feature, there is provided a design method for a bus system equipped with a plurality of device units, a data bus to which the plural device units are connectible, a timing-signal supply source for supplying a timing signal to the plural device units through a timing-signal bus, a bus switch for connecting and disconnecting a signal between the plural device units and the data bus, and a bus switch controller for controlling connecting and disconnecting operations performed by the bus switch, comprising the steps of: for each of the plural device units, computing noise propagation timing at which, when each of the device units is connected to the data bus being active, a noise propagates to other one of said plural device units or another device connected to the data bus based on a period of the timing signal, a signal propagation delay in each of the device units, signal propagation delays in the timing-signal bus and the data bus, and a setup time in the other device unit or in the device connected to the data bus; and computing, based on the noise propagation timing computed in the step of computing noise propagation timing, connection timing at which each of the device units is to be connected to the data bus.

As a preferable feature, in the step of computing connection timing, the connection timing may be computed by computing a delay time needed for the bus switch to connect each of the device units to the data bus after each of the device units is connected to the timing-signal bus.

As another preferable feature, in the step of computing noise propagation timing, a timing margin $M\{=(T+g)-(a+b+c+d+e+f)-S\}$ between arrival of the noise at the other device unit or the device connected to the data bus and start of the setup time may be computed as propagation timing of the noise, based on the period "T" of the timing signal, skew "a" from the timing-signal supply source to the bus switch controller, a control delay time "b" between receipt of the timing signal and issue of a connection control signal for connecting each of the device units and the data bus to the bus switch in the bus switch controller, a signal propagation delay time "c" between the bus switch controller and the bus switch, an operating delay time "d" of the bus switch, a pulse width (time) "e" of the noise, a propagation delay time "f" of the noise in each of the device units and the data bus, skew "g" from the timing-signal supply source to the other device unit or the device connected to the data bus, and a setup time "S" in the bus system; and in the step of computing connection timing, the control delay time "b" of the bus switch may be computed so that the timing margin M is 0 or greater.

As a second generic feature, there is provided a bus system comprising: a plurality of device units; a data bus to which the plural device units are connectable; a timing-signal supply source for supplying a timing signal to the plural device units through a timing-signal bus; a bus switch for connecting and disconnecting a signal between the plural device units and the data bus; and a bus switch controller for controlling the connecting and disconnecting operations of the bus switch by issuing, to the bus switch, a connection control signal for connecting each of the plural device unit and the data bus; wherein the bus switch controller controls the bus switch so that each of the device units is connected to the data bus after a control delay time "b" between receipt of the timing signal and issue of the connection control signal to the bus switch in the bus switch controller after each of the device units is connected to the timing-signal bus; and on the basis of the period "T" of the timing signal, skew "a" from the timing-signal supply source to the bus switch controller, the control delay time "b", a signal propagation delay time "c" between the bus switch controller and the bus switch, an operating delay time "d" of the bus switch, a pulse width (time) "e" of a noise caused when each of the device units is connected to the data bus being active, a propagation delay time "f" of the noise in each of the device units and the data bus, skew "g" from the timing-signal supply source to other one of the plural device units or a device connected to the data bus, and a setup time "S" in the bus system, the control delay time "b" is computed as a value such that a timing margin M{=(T+g)−(a+b+c+d+e+f)−S} from arrival of the noise at the other device unit or the device to start of the setup time is 0 or greater.

As a preferable feature, the bus switch controller may include an adjustment circuit for changing a phase of the timing signal, which is supplied by the timing signal supply source through the timing-signal bus, and issue the connection control signal to the bus switch based on the timing signal whose phase has been changed. As another preferable feature, the adjusting circuit may be a PLL (phase locked loop) circuit or a DLL (delay locked loop) circuit.

As a third generic feature, there is provided a device unit installable to a bus unit equipped with a data bus, a timing-signal supply source, and a timing-signal bus connected to the timing-signal supply source, comprising: a bus switch for connecting and disconnecting a signal between the device unit and the data bus; and a bus switch controller for controlling connecting and disconnecting operations of the bus switch by issuing, to the bus switch, a connection control signal for connecting the device unit and the data bus; wherein the bus switch controller controls the bus switch so that the device unit is connected to the data bus after a control delay time "b" between receipt of the timing signal and issuing of the connection control signal to the bus switch in the bus switch controller after the device unit is connected to the timing-signal bus; and on the basis of a period "T" of the timing signal, skew "a" from the timing-signal supply source to the bus switch controller, the control delay time "b", a signal propagation delay time "c" between the bus switch controller and the bus switch, an operating delay time "d" of the bus switch, a pulse width (time) "e" of a noise caused when the device unit is connected to the data bus being active, a propagation delay time "f" of the noise in the device unit and the data bus, skew g from the timing-signal supply source to another device unit other than the first device unit or a device connected to the data bus, and a setup time "S" in the bus system, the control delay time "b" of the bus switch is computed as a value such that a timing margin M{=(T+g)−(a+b+c+d+e+f)−S} from arrival of the noise at the second device unit or the device to start of the setup time is 0 or greater.

As a preferable feature, the bus switch controller may include an adjustment circuit for changing a pulse of the timing signal, which is supplied by the timing-signal supply source through the timing-signal bus, and issue the connection control signal to the bus switch based on the timing signal whose phase has been changed. As another preferable feature, the adjusting circuit may be a PLL (phase locked loop) circuit or may be a DLL (delay locked loop) circuit.

As a fourth generic feature, there is provided a device unit installable to a bus unit equipped with a data bus, a timing-signal supply source, and a timing-signal bus connected to the timing-signal supply source, comprising: a bus switch for connecting and disconnecting a signal between the device unit and the data bus; and a bus switch controller, including an adjustment circuit for changing a phase of a timing signal supplied by the timing signal supply source through the timing-signal bus, for controlling connecting and disconnecting operations of the bus switch by issuing, to the bus switch, a connection control signal for connecting the device unit and the data bus based on the timing signal whose phase has been changed. As another preferable feature, the adjusting circuit may be a PLL (phase locked loop) circuit or may be a DLL (delay locked loop) circuit.

The bus system design method, the bus system, and the device unit of the present invention has the following effects and advantages:

(1) Even when data communications is being performed through a data bus, device units can be connected or disconnected. Thus, the bus system, in addition to being able to enhance system reliability, is very convenient for use.

(2) Since there is no possibility that noise, caused by connecting a device unit on a data bus being active, will have an adverse influence on other device units connected to this data bus or devices connected to the data bus, device units can be connected on the data bus being active, without stopping the transmission of data through the data bus. Thus, in addition to being able to enhance data transmission efficiency, there is no need to monitor whether or not a device unit is inserted in the data bus, and there is no need to perform a variety of controls for stopping the PCI bus. Therefore, system controls can be simplified and development and operating costs can be reduced.

(3) With the bus switch controller including an adjusting circuit that can adjust a phase of a timing signal supplied by the timing-signal supply source through the timing-signal bus, the control delay time "b" can be surely adjusted and realized with ease and additionally the connection timing of the bus switch can be set in detail.

(4) Concerning fitting the device unit to another mother board, even if the device unit is inserted into the other mother board on active (active connection), noise caused by the active connection does not affect other devices on the mother board by computing an optimum amount of the phase change in the adjusting circuit for the mother board and by setting the change amount through a program. This manner is versatile and economical.

(5) If the connection timing between the device unit and the data bus is computed by computing a delay time needed for the bus switch to connect the device unit and the data bus after the connection between the device unit and the timing signal bus is established, the connection timing between the device unit and data bus can be easily determined.

(6) On the basis of the cycle "T" of the timing signal, skew "a" from the timing-signal supply source to the bus switch controller, the delay time "b" between receipt of the timing signal and issue of a connection control signal for connecting the device unit and the data bus to the bus switch in the bus switch controller, a signal propagation delay time "c" between the bus switch controller and the bus switch, operating delay time "d" of the bus switch, a pulse width (time) "e" of a noise, a propagation delay time "f" of the noise in the device unit and the data bus, skew "g" from the timing-signal supply source to another device unit or a device connected to the data bus, and a setup time "S" in the bus system, the delay time "b" of the bus switch is computed so that the timing margin M{=(T+g)−(a+b+c+d+e+f)−S} from arrival of the noise at the other device unit or the device connected to the data bus to start of the setup time is 0 or greater. Therefore, the connection timing between the device unit and the data bus can be easily determined.

BRIEF DESCRIPTION OF THE DRAWINGS

The present invention will be described in further detail with reference to the accompanying drawings wherein.

DETAILED DESCRIPTION OF THE PREFERRED EMBODIMENT

A preferred embodiment of the present invention will hereinafter be described in detail with reference to the accompanying drawings.

A bus system according to a preferred embodiment of the present invention is, for example, a PCI bus system provided with a PCI bus employed in a storage system, etc. Such a storage system is equipped with a plurality of disk units (magnetic disk units, physical device units) and writes data from a server (host) to these disk units in response to access from the server and reads data requested by the server from the disk units and transmits the data. The PCI bus system here is used for transmitting and receiving data signals.

The above-described storage system is equipped with a host interface module (device unit), which controls interface (data transfer) with a server through a fiber channel interface bus. This host interface module is connected to a PCI bridge module through an interface bus such as a PCI bus and is used to transmit data to a disk interface module, management module, etc., connected to the PCI module through the PCI bus.

The host interface module is constructed as a single unit by mounting a central processing unit (CPU), memory, and other devices on a printed-circuit board (PCB). The host interface module thus constructed as a single unit is detachably inserted into (connected to) a mother board having a PCI bus, whereby the devices constituting the host interface module is communicably connected to the PCI bus. In this way, storage systems are constructed to meet desired specification.

As a bus system of a preferred embodiment of the present invention, a description will be given in relation to a PCI bus system in which a number of device units such as host interface modules can be fitted onto a mother board (a bus unit).

Figure 1:
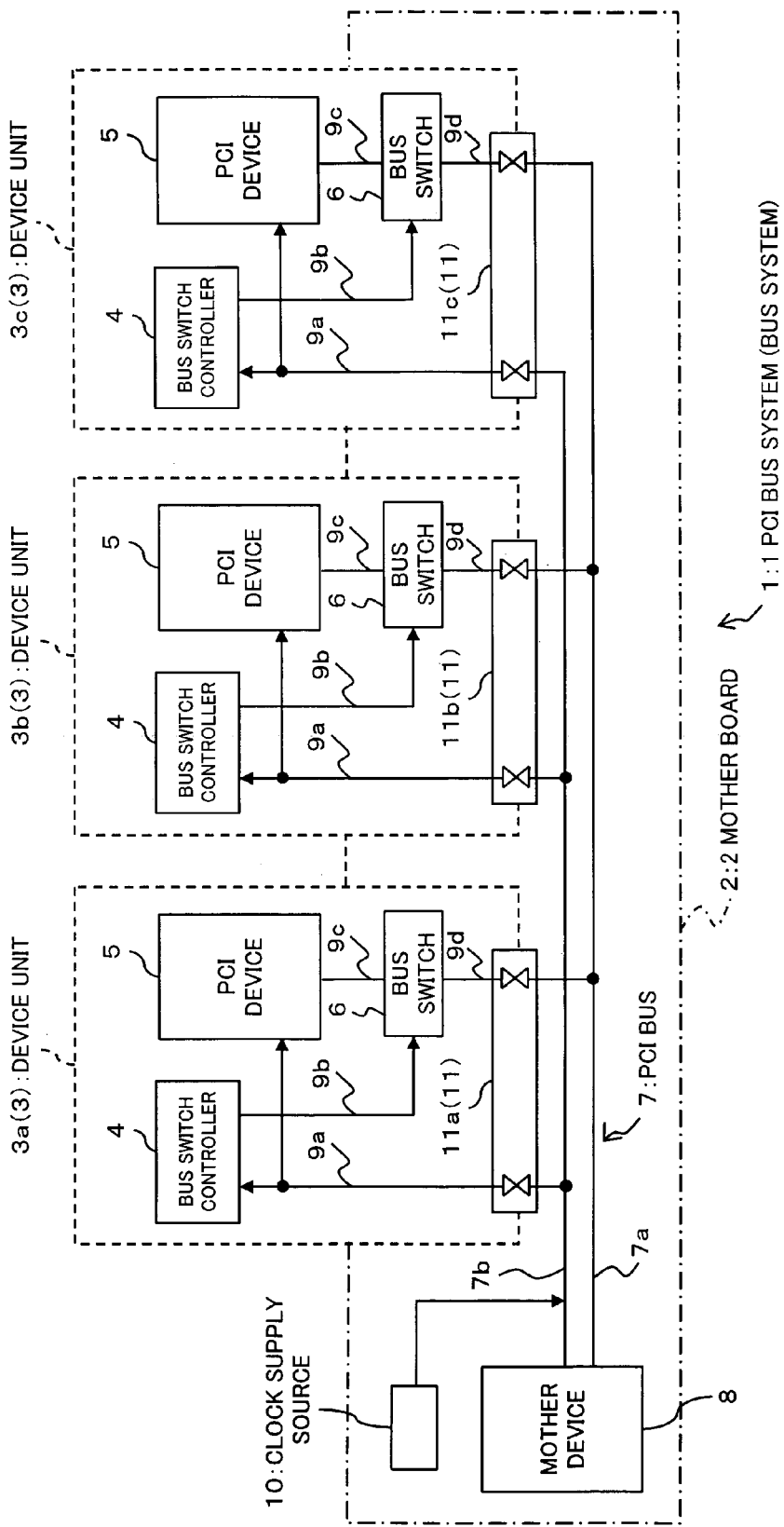
FIG. 1 is a block diagram schematically showing the configuration of a bus system (PCI bus system) in accordance with a preferred embodiment of the present invention.
Figure 2:
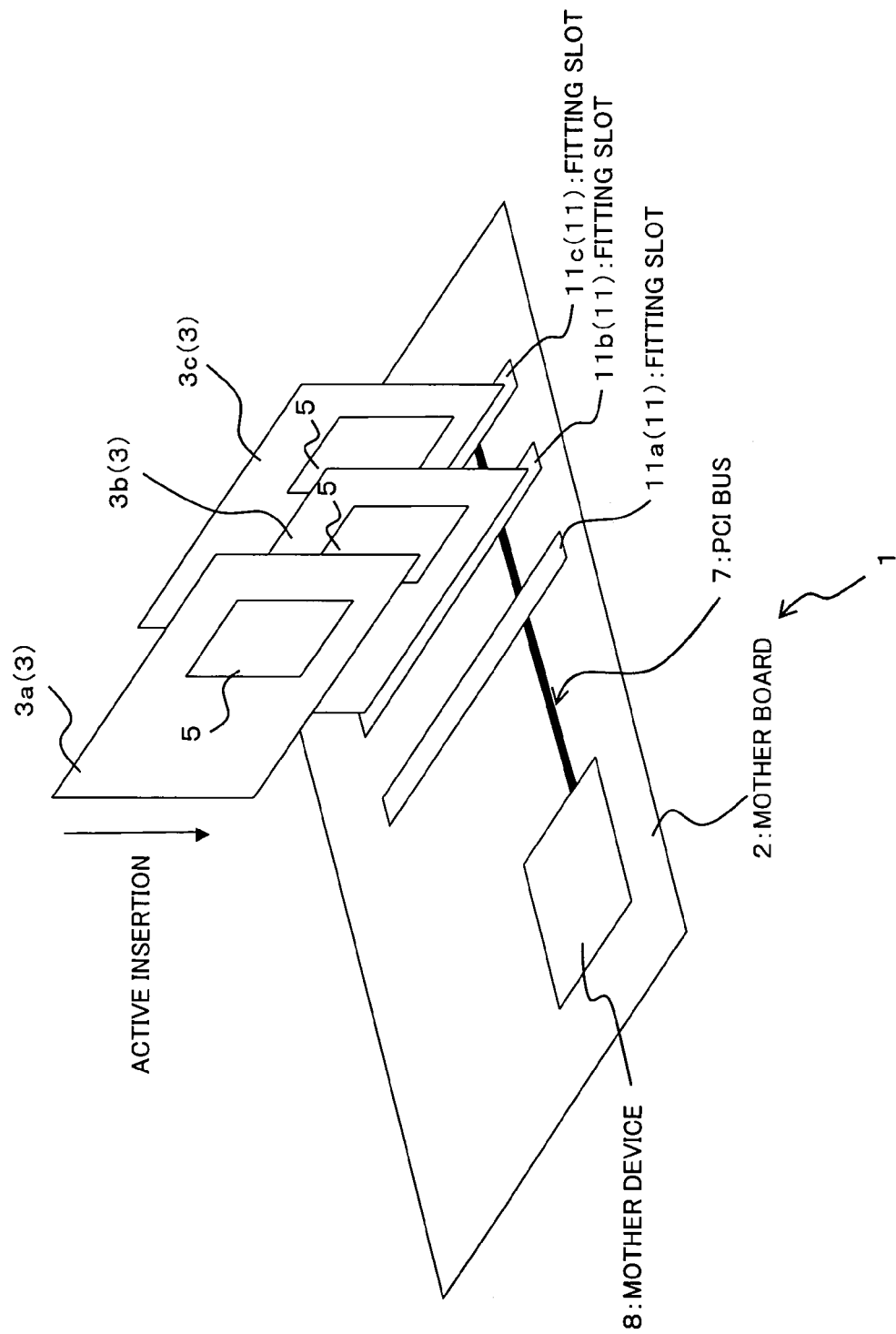
FIG. 2 is a perspective view of the PCI bus system.

FIG. 1 shows the configuration of the bus system (PCI bus system) of the preferred embodiment and FIG. 2 is a perspective view of the bus system. A PCI bus system 1 is equipped with a mother board (bus unit) 2 and a plurality of device units (e.g., three device units 3a, 3b, and 3c in FIGS. 1 and 2), as shown in FIG. 1. These device units 3a, 3b, and 3c are constructed to detachably fit in fitting slots 11a, 11b, and 11c formed on the mother board 2, respectively. The device units 3a, 3b, and 3c are fitted in (inserted into) the fitting slots 11a, 11b, and 11c, respectively, to be communicably connected to the PCI bus 7 of the mother board 2. The device units 3a, 3b, and 3c can also be connected to or disconnected from the mother board 2 even in an active state.

Note that active insertion or active connection used herein is intended to mean that the device units 3a, 3b, and 3c are fitted in the mother board 2 that is active (in an active state or in a current-carrying state). Also, although FIG. 2 shows the three fitting slots 11, the present invention is not limited to the number. For example, the mother board 2 may contain two or less fitting slots, or four or more fitting slots. Each device unit 3 may be fitted in any of the fitting slots 11.

In addition to the fitting slots 11a, 11b, and 11c, the mother board (bus unit) 2 has a PCI bus 7, a mother device 8 and a clock supply source 10 on the printed-circuit board. The PCI bus 7 includes a data bus 7a and a clock bus (timing signal bus) 7b. The clock supply source (timing-signal supply source) 10 is used for supplying a clock signal (timing signal) to each device unit 3 fitted in the PCI bus system 1 through the clock bus 7b.

The mother device 8 performs various processes related to the transmission and reception of data signals through the PCI bus 7, and is communicably connected to the data bus 7a and clock bus 7b to receive a clock signal supplied from the clock supply source 10.

The data bus 7a is a data path (bus) for data transmission and data reception performed between the mother device 8 and device units 3a, 3b, and 3c. The clock bus 7b is a bus for connecting the clock supply source 10 with the device units 3a, 3b, and 3c and mother device 8, and supplies the clock signal from the clock supply source 10 to the device units 3a, 3b, and 3c through the fitting slots 11a, 11b, and 11c. Both the data bus 7a and the clock bus 7b have the fitting slots 11a, 11b, and 11c formed along the ways to be connected to the device units 3a, 3b, and 3c through the fitting slots 11a, 11b, and 11c, respectively.

The fitting slots 11a, 11b, and 11c are used for mounting (or inserting) the device units 3a, 3b, and 3c on the mother board 2 and formed by, for example, connectors equipped with an access terminal, etc. With the device units 3a, 3b, and 3c mounted on the mother board 2, the clock bus 7b of the mother board 2 is connected with the buses 9a of the device units 3a, 3b, and 3c, and the data bus 7a of the mother board 2 is communicably connected with the buses 9b of the device units 3a, 3b, and 3c. Note that these fitting slots 11a, 11b, and 11c are approximately the same in structure. Reference numerals 11a, 11b, and 11c are employed when one of the fitting slots needs to be specified, and reference numeral 11 represents an arbitrary fitting slot.

The device units 3a, 3b, and 3c are the host interface modules in a storage system, as previously mentioned. Each device unit is constructed by arranging a bus switch controller 4, a bus switch 6, a PCI device 5, and buses 9a, 9b, 9c, and 9d on a printed-circuit board and can be detachably fitted on the corresponding fitting slot 11a, 11b, or 11c formed in the mother board 2.

The above-described device units 3a, 3b, and 3c are nearly the same in construction. For that reason, reference numerals 3a, 3b, and 3c are employed when one of the device units needs to be specified, and reference numeral 3 denotes an arbitrary device unit.

In the preferred embodiment, the device unit 3a is mounted on the fitting slot 11a, the device unit 3b is mounted on the fitting slot 11b, and the device unit 3c is mounted on the fitting slot 11c. In the preferred embodiment, the device units 3a, 3b, and 3c are much the same in construction, so the device unit to be fitted in the fitting slot 11a can be specified as the device unit 3a. Likewise, the devices units that are to be fitted in the fitting slots 11b and 11c can be specified as the device units 3b and 3c, respectively.

Note that in the case where the device units 3 are the host interface modules in a storage system, each device unit 3 includes memory, a CPU, and a fiber channel interface in addition to the above-described switch controller 4, PCI device 5, bus switch 6, and buses 9a, 9b, 9c, and 9d. However, in FIG. 1, the memory, CPU, and fiber channel interface are not shown for convenience. Only the switch controller 4, PCI device 5, bus switch 6, and buses 9a, 9b, 9c, and 9d, which is related to the transmission and reception of data signals through the PCI bus 7, appears in each device unit in the drawing.

In the device unit 3, the bus switch controller 4 and the bus switch 6 are communicably connected through the second bus 9b. The PCI device 5 and the bus switch 6 are communicably connected through the third bus 9c. Also, in the device unit 3, the first bus 9a is formed so that when the device unit 3 is fitted in the mother board 2 through the fitting slot 11, the bus switch controller 4 and PCI device 5 are communicably connected to the clock bus 7b formed in the mother board 2. Similarly, the fourth bus 9d is formed so that when the device unit 3 is fitted in the mother board 2 through the fitting slot 11, the bus switch 6 is communicably connected to the data bus 7a.

The PCI device 5 performs various processes related to the transmission and reception of data signals performed with the mother board 2 and other device units 3 through the PCI bus 7 (data bus 7a). Specifically, a clock signal, which is supplied from the clock supply source 10 through the clock bus 7b and fitting slot 11, is input to the PCI bus 5 through the clock signal bus 9a. The PCI device 5 operates responsive to that clock signal, and sends and receives data signals to and from the data bus 7a through the bus 9c, bus switch 6, bus 9d, and fitting slot 11.

The bus switch 6 is mounted between the PCI device and the data bus 7a (fitting slot 11), and connects or disconnects a data signal between the PCI device 5 and the data bus 7a by connecting or disconnecting the third bus 9c and the fourth bus 9d. This bus switch 6 also performs the connecting operation or disconnecting operation in response to control (a connection instruction) from the bus switch controller 4.

The bus switch controller 4 is used for controlling the connecting/disconnecting operation of the bus switch 6 by issuing, to the bus switch 6, a connection instruction (a connection control signal) for connecting the device unit 3 and the data bus 7a. This bus switch controller 4 receives a clock signal, supplied through the clock bus 7b and fitting slot 11 from the clock supply source 10, through the bus 9a, and is operable based on that clock signal. Further, the bus switch controller 4 is able to connect the PCI device 5 to the data bus 7a at arbitrary timing by controlling the timing at which the bus switch 6 is connected. More specifically, the bus switch controller 4 controls the bus switch 6 so that the device unit 3 (PCI device 5) is connected to the data bus 7a after a previously set time "b" (control delay time "b" described below) elapses from the connection of the device unit 3 (the bus switch controller 4) with the clock bus 7b. The structure of the bus switch controller 4 will be detailed below.

If the device unit 3 constructed as described above is inserted in the fitting slot 11 formed in the mother board 2, as shown in FIG. 2, one end of the first bus 9a in the device unit 3 is communicably connected to the clock bus 7b formed in the mother board 2, and one end of the fourth bus 9d in the device unit 3 is communicably connected on the data bus 7a formed in the mother board 2. In the example shown in FIG. 2, for convenience, only the PCI device 5 is shown in each device unit 3 and the bus switch controller 4, bus switch 6, and other components are omitted.

Next, a description will be given in relation to the computation of the control delay time "b" needed for the bus switch controller 4 to control connection of the bus switch 6 (bus system design method).

FIGS. 3A to 3G are timing diagrams in connecting device units to the PCI bus system 1 being in an active state. FIG. 3A shows a clock signal (base clock) output by the clock supply source 10; FIG. 3B shows the clock signal input into the bus switch controller 4; FIG. 3C shows a connection instruction signal that the bus switch controller 4 issues to the bus switch 6; FIG. 3D shows a connection enable (out enable) state of the bus switch 6; FIG. 3E shows a noise caused in the device unit 3; FIG. 3F shows the noise propagated to other device units; and FIG. 3G shows the clock signal input to another device unit.

The description made with reference to FIGS. 3A-3G assumes that the device unit 3(3a) is connected to the fitting slot 11a on the mother board 2 in an active state.

As shown in FIGS. 3A to 3G, based on the clock cycle "T" of the clock supply source 10, signal propagation delay in the device unit 3, signal propagation delay in the PCI bus 7 (clock bus 7b and data bus 7a), and setup time in the device unit 3 or other devices (e.g., mother board 2 or other devices) connected to the data bus 7a, the bus system design method of the present invention computes the timing at which the noise, caused when the device unit 3 is connected on the data bus 7a being active, propagates to another device units 3 or to a device (mother device 8, etc.) connected to the data bus 7a (noise computing step).

For instance, if the device unit 3a is inserted into the mother board 2, the first bus 9a of the device unit 3a is connected to the clock bus 7b, and the fourth bus 9d of the device unit 3a is connected to the data bus 7a. Thereafter, if a clock signal is output from the clock supply source 10 (see point A of FIG. 3A), that clock signal arrives at the bus switch controller 4 of the device unit 3a through the clock bus 7b and bus 9a after a delay of time "a" (see point B of FIG. 3B). The time "a" is the clock skew (skew) "a" from the clock supply source 10 to the bus switch controller 4.

The bus switch controller 4 outputs a connection instruction signal (a connection control signal) to the bus switch 6 after the delay time (the control delay time) "b" elapses from receipt of the clock signal (see point C of FIG. 3C). The connection control signal issued by the bus switch controller 4 takes a time period c (a signal propagation delay time c) to reach the bus switch 6 through the bus 9b, and it further takes connection operation time (operating delay time) "d" for the bus switch 6 to make the bus 9c and the bus 9d a connection (out enable) state after reception of the connection instruction signal (see point D of FIG. 3D).

When the bus switch 6 becomes a connection state, a noise with a predetermined pulse width "e" occurs in the device unit 3a (see point E of FIG. 3E). In this embodiment, the time "e" during which the noise occurs is referred to as the pulse width of the noise.

The noise from the device unit 3a arrives at other device units 3b and 3c after a delay of noise propagation time "f" caused by propagation delays at the bus 9d and data bus 7a (see point F of FIG. 3F).

On the other hand, until the clock signal supplied from the clock supply source 10 reaches the device units 3b and 3c other than the device unit 3a among a number of device units mounted on the mother board 2, propagation delay time (clock skew or skew) "g" is caused by the clock bus 7b (see point G of FIG. 3G).

Note that the above-described clock skew "a," the signal propagation delay time "c," the noise pulse width "e," the noise propagation delay time "f," and the clock skew "g" are determined by the circuit design of the mother board 2 and device units 3 and the construction (e.g., circuit length, material, chip performance, etc.) of the printed-circuit board, while the operating delay time "d" of the bus switch and the setup time 'S' for the bus system 1 are determined by the specification of the device units 3.

In the device units 3, mother device 8 and others, etc., various devices that operate based on the timing signal (clock signal or data strobe signal) supplied from the clock supply source 10 perform each process at the leading edge or the trailing edge of the clock signal. Generally, such devices have to secure and hold a data signal prior to a clock signal (timing signal). In general, the minimum time needed to secure and hold a data signal is called setup time. Note that in FIG. 3G, the setup time is represented by oblique lines.

The setup time is prescribed for each semiconductor product or each bus specification, and using the leading edge or the trailing edge of a timing signal as a reference, it is necessary to settle a data signal before the setup time. Therefore, if the noise, which occurs in connecting the device unit 3 to the mother board 2 being in an active state, can be prevented from overlapping each of the setup times S of other device units 3b and 3c or devices connected to the PCI bus 7 to which that device unit 3a is connected, problems due to the influence of that noise can be eliminated.

As a solution, in the bus system design method of the present invention, the time interval between the time (see point H in FIG. 3F) that the noise caused by the active connection of the device unit 3 arrives at other device units 3 or devices connected to the PCI bus 7 to which that device unit 3a is connected and the time (see point I in FIG. 3F) that each of the setup times S in other device units 3 or other devices connected to the PCI bus 7 ends, that is, the time from the arrival of the noise at other device units 3 or devices connected to the PCI bus 7 to the start of the setup time "S" is computed as timing margin M (noise propagation computing step), and the delay time "b" is computed so that the timing margin M is 0 or greater (timing computing step). More specifically, the timing margin M is computed based on by the following Eq. (1):

$$M=(T+g)-(a+b+c+d+e+f)-S \quad (1)$$

where, "a" is the clock skew from the clock supply source 10 to the bus switch controller 4, "c" is the propagation delay time for the bus 9b to send a connection instruction signal issued from the bus switch controller 4 to the bus switch 6 through the bus 9b, "d" is the connection operation time (operating delay time) needed for the bus switch 6 to connect the bus 9c and the bus 9d together after reception of the connection instruction signal, "e" is the pulse width (time) of a noise, 'f' is the propagation delay time in the bus 9d and data bus 7a that occurs until noise from the device unit 3a arrives at other device units 3b and 3c, "g" is the propagation delay in the clock bus 7b that occurs until the clock signal from the clock supply source 10 arrives at the device units 3b and 3c other than the device unit 3a on the mother board 2, and is the clock skew (skew) between the active-connected device unit 3a and the device units 3b, 3c or other devices active-connected on the same data bus 7a.

That is, the above-described parameters (the cycle "T" of the clock signal, the clock skew "a" from the clock supply source 10 to the bus switch controller 4 that is able to control connection/disconnection of the bus switch 6, a control delay time "b", the signal propagation delay time "c" between the bus switch controller 4 and the bus switch 6, the operating delay time "d" of the bus switch 6, the pulse width (time) "e" of a noise, propagation delay time "f" of the noise in the device unit 3 and data bus 7a, clock skew "g" from the clock supply source 10 to the device units 3b, 3c or other devices connected on the same data bus 7a, and setup time "S" in the PCI bus system 1) are set so that the timing margin M computed by the above-described Eq. 1 is 0 or greater.

In this embodiment, the bus switch controller 4 performs the setting of the timing margin M by adjusting and setting the time "b" (control delay time "b") from the connection between the device unit 3 (bus switch controller 4) and the clock bus 7b to the connection between the device unit 3 (PCI device 5) and the data bus 7a.

That is, the control delay time "b" is computed to have a value such that the timing margin M computed by the above-described Eq. 1 is 0 or greater.

To connect each of the device units 3 to the mother board 2 that is in an active state, it is necessary to compute each delay time "b" so that noise from each of the device units does not overlap the setup time of each of the device units.

For example, as shown in FIG. 1, to design the PCI bus system 1 in which three device units 3a, 3b, and 3c are connectible to the mother board 2 being active, consideration should be paid so that a noise caused by the active connection of each of the device units 3a, 3b, and 3c does not affect the setup time for each of the remaining device units 3a, 3b, and 3c. For that reason, it is important to design the PCI bus system 1 so that a noise caused by the active insertion of the device unit 3a does not overlap the setup times for the device unit 3b and for the device unit 3c, so that a noise caused by the active insertion of the device unit 3b does not overlap the setup times for the device unit 3a and for the device unit 3c, and so that a noise caused by the active insertion of the device unit 3c does not overlap the setup time for the device unit 3a and for the device unit 3b.

That is, to compute the delay time "b" meeting the above-described conditions for each of the device units 3a, 3b, and 3c, the timing margin M1 for the device unit 3a to be connected to the mother board 2 in an active state is computed based on the following Eq. (2). Next, the timing margin M2 for active insertion of the device unit 3b is computed based on the following Eq. (3), and the timing margin M3 for active insertion of device unit 3c is computed based on the following Eq. (4).

$$M1=\min[\{(T+g_{12})-(a+b+c+d+e+f_{12})-S\}, \{(T+g_{13})-(a+b+c+d+e+f_{13})-S\}] \quad (2)$$

In Eqs. (2), (3), and (4), the reference characters T, a, b, c, d, e, and S are the same or approximately the same as the aforementioned reference characters. The equation min[a, b] is intended to mean that the smaller of the two (a and b) is selected. The character $g_{12}$ is the clock skew between the device unit 3a and the device unit 3b, and $g_{13}$ is the clock skew between the device unit 3a and the device unit 3c. The character $f_{12}$ is the propagation time of a noise from the device unit 3a to the device unit 3b, and $f_{13}$ is the propagation time of noise from the device unit 3a to the device unit 3c.

$$M2=\min[\{(T+g_{21})-(a+b+c+d+e+f_{21})-S\}, \{(T+g_{23})-(a+b+c+d+e+f_{23})-S\}] \quad (3)$$

where $g_{21}$ is the clock skew between the device unit 3b and the device unit 3a (in this embodiment, $g_{21}$ is the same as $g_{12}$), $g_{23}$ is the clock skew between the device unit 3b and the device unit 3c, $f_{21}$ is the propagation time of a noise from the device unit 3b to the device unit 3a (in this embodiment, $f_{21}$ is the same as $f_{12}$), and $f_{23}$ is the propagation time of a noise from the device unit 3b to the device unit 3c.

$$M3=\min[\{(T+g_{31})-(a+b+c+d+e+f_{31})-S\}, \{(T+g_{32})-(a+b+c+d+e+f_{32})-S\}] \quad (4)$$

where $g_{31}$ is the clock skew between the device unit 3c and the device unit 3a (in this embodiment, $g_{31}$ is the same as $g_{13}$), $g_{32}$ is the clock skew between the device unit 3c and the device unit 3b (in this embodiment, $g_{32}$ is the same as $g_{23}$), $f_{31}$ is the propagation time of a noise from the device unit 3c to the device unit 3a (in this embodiment, $f_{31}$ is the same as $f_{13}$), and $f_{32}$ is the propagation time of a noise from the device unit 3c to the device unit 3b (in this embodiment, $f_{32}$ is the same as $f_{23}$).

After computing the control delay time "b" to make the above-described timing margins M1, M2, and M3 is 0 or greater, the PCI bus unit is set so that in the device unit 3, the bus switch controller 4 connects the device unit 3 (PCI device 5) and the data bus 7a together after a predetermined time "b" (control delay time "b") elapses from the connection of the device unit 3 (bus switch controller 4) with the clock bus 7b. Such setting can be easily realized by installing a delay circuit in the bus switch controller 4, designing a circuit length so that a propagation delay equivalent to the control delay time "b" occurs within the bus switch controller 4, or changing timing (phase) of the clock signal.

In this embodiment, the bus switch controller 4 changes the phase of the clock signal supplied by the clock supply source 10 to cause the control delay time b.

Figure 4:
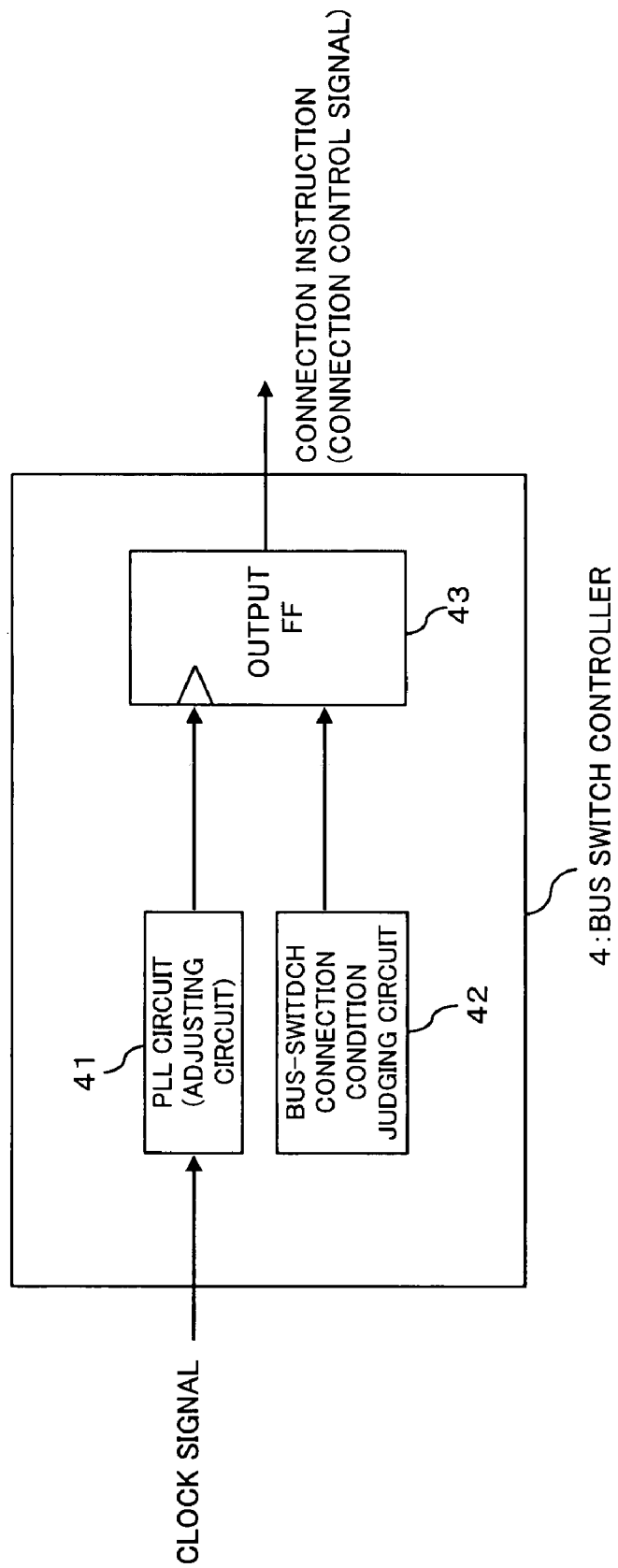
FIG. 4 is a block diagram schematically showing a bus switch controller of the bus system (PCI bus system).

FIG. 4 shows the bus switch controller 4 in the bus system (PCI bus system) according to a preferred embodiment of the present invention. As shown in FIG. 4, the bus switch controller 4 comprises a PLL circuit 41, a bus-switch connection condition judging circuit 42, and an output FF (Flip-Flop) 43.

The bus-switch connection condition judging circuit 42 judges as to whether or not the bus switch 6 is to connect the bus 9c to the bus 9d, and more specifically, on the basis of various state in the PCI bus system 1 and various status of programs and others, judges whether or not a bus switch connection condition previously determined is satisfied, and if the result of the judgment is positive, issues an ON signal to the output FF 43.

The PLL (phase locked loop) circuit 41 is an adjusting circuit that can change the phase of the clock signal supplied by the clock supply source 10 through the clock bus 7b, and the amount of phase change is adjusted by means of a program or the like.

The PLL circuit 41 generally feedback-controls oscillation by an oscillator inside the loop such that a reference signal input from an external unit has a constant phase difference from an output from the oscillator. By using the phase adjustment function of the PLL circuit 41 to change the phase of the clock supplied by the clock supply source 10, the PCI bus system 1 issues, to the bus switch 6, a connection instruction (a connection control signal) for connecting the device unit 3 (the PCI device 5) and the data bus 7a after the control delay time b since the clock signal is input into the bus switch controller 4 when the device unit 3 is fitted to the mother board 2 and the bus switch controller 4 receive the clock signal.

An amount of phase change in the PLL circuit 41 is computed to be the optimum value, i.e., such that while the bus-switch connection condition judging circuit 42 outputs an ON signal, the time between receipt of the clock signal in the bus switch controller 4 and issue, to the bus switch 6, a connection instruction to the bus switch from the bus switch controller 4 is b, in consideration of an internal delay of the output FF 43. The PLL circuit 41 is set so as to realize such phase change when (before) the PLL circuit 41 is dispatched from a factory.

If the device unit 3 is to be fitted to another mother board (bus unit), the optimum amount of phase change of the PLL circuit 41 for the new mother board is re-computed and the PLL circuit 41 is set so as to realize re-computed optimum phase change.

The output FF 43 receives an output signal from the PLL circuit 41 and an output signal from the bus-switch connection condition judging circuit 42. An output signal from the output FF 43 is input into the bus switch 6 (specifically through an out enable terminal of the bus switch).

While the bus-switch connection condition judging circuit 42 issues an ON signal, the output FF 43 sequentially outputs an ON signal (a connection instruction, a connection control signal) in synchronization with the leading edge of a signal supplied from, for example, the PLL circuit 41.

In other words, on the basis of the clock signal whose phase has been changed by the PLL circuit 41, the bus switch controller 4 outputs a connection control signal to connect the device unit 3 and the data bus 7a.

The above-mentioned functions of the three units of the PLL circuit 41, the bus-switch connection condition judging circuit 42 and the output FF 43 may be formed on a single LSI (large scale integration) to realize the bus switch controller 4. Alternatively, the functions may be dividedly implemented on two or more IC chips.

According to the PCI bus system 1 as the preferred embodiment of the present invention, as a result of designing the PCI bus system 1 as described above, even when the device unit 3 is inserted in any of the fitting slots 11 in the mother board 2 being active, there is no possibility that a noise caused by the active connection will have an adverse influence on the other device units 3 connected on the PCI bus 7. In addition to being able to enhance the reliability of the PCI bus system 1, it is very convenient because even when data communications is being performed through the PCI bus 7, the device units 3 can be connected or disconnected without taking the influence of the noise into account.

In connecting the device units 3 to the mother board 2, since the mother board 2 does not need to be made inactive (e.g., power disconnection from the mother board 2), data transmission can be efficiently performed. Also, since in connecting the device units 3, there is no need for control to stop the PCI bus 7, the system 1 can be made structurally simple, and the manufacturing and running costs can be reduced.

As shown by Eqs. (2) to (4), the common control delay time "b" for the bus switch controllers 4 in the device units 3 is set so that, noise caused by the active insertion of each device unit 3 does not overlap the setup times of the remaining device units. Therefore, individual setting does not have to be performed for each device unit 3, the manufacturing costs can be reduced, and the PCI bus system 1 is very convenient for use.

Since the device units 3 are approximately the same in construction, and the control delay time "b" for the bus switch controller 4 is set commonly to the device unit 3, each device unit can be fitted in any of the fitting slots 11. Thus, the PCI bus system 1 is very convenient for use.

Further, with the bus switch controller 4 including the PLL circuit (adjusting circuit) 41 that can change a phase of the clock signal, the control delay time b can be surely adjusted and realized with ease and additionally the connection timing of the bus switch 6 can be set in detail.

Even if the device unit 3 is to be mounted on another mother board on active (active connection), a noise caused by the active connection does not affect other devices on the mother board by computing an optimum amount of the phase change in the PLL circuit 41 for the mother board and subsequently by setting the optimum change amount in PLL circuit 41 through a program. This manner is versatile and economical.

While the present invention has been described with reference to the preferred embodiment thereof, the invention should by no means be limited to the details given herein, but may be modified within the scope of the invention hereinafter claimed.

For example, in the above-described embodiment, the clock signal supplied from the clock supply source 10 is used as a timing signal, but the present invention is not limited to the clock signal. For instance, a data strobe signal may be alternatively used as a timing signal.

In the examples shown in FIGS. 3C and 3D, regarding the trailing edge as reference, the connection instruction signal from the bus switch controller 4 is output and the bus switch 6 is enabled. However, leading edges may be regarded as reference.

The signals shown in FIGS. 3A, 3B, and 3E to 3G employ the leading edges as reference, but alternatively they may employ the trailing edges.

In the above-described embodiment, the clock supply source (timing-signal supply source) 10 is provided outside the mother device 8 of the mother board 2, but there may be provided a clock bus supply source (timing signal source) 10 inside the mother device 8. In this case a clock signal is supplied from that clock bus supply source 10 to the clock bus 7b.

Figure 3:
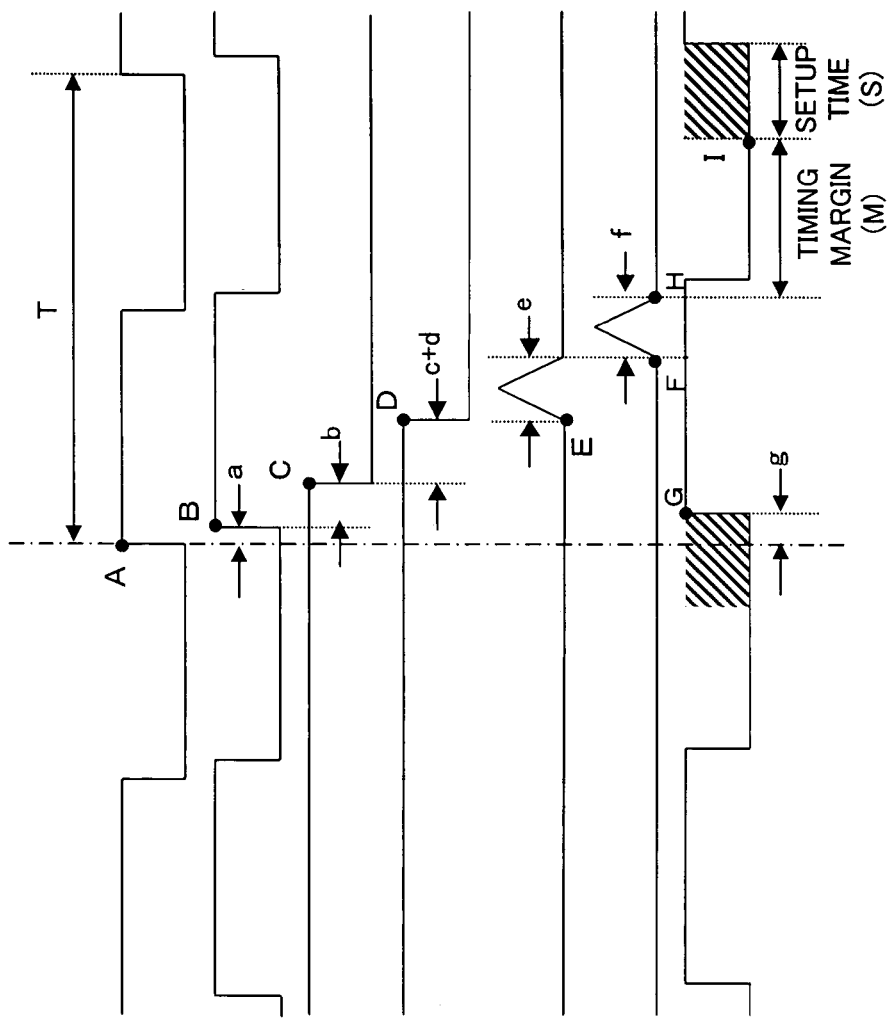
FIGS. 3A to 3G are timing diagrams in connecting a device unit to the PCI bus system being active.

In the embodiment described with reference to FIG. 3, when designing the PCI bus system 1 in which three device units 3a, 3b, and 3c are connectable to the mother board being active, the timing margins M1, M2, and M3 are computed so that a noise caused by active connection of each of the device units 3a, 3b, and 3c has no influence on the setup time of the remaining device units 3a, 3b, and 3c, and the control delay time "b" is determined. However, the present invention is not limited to this embodiment. It is also important that the noise caused by the active connection of the device unit 3 should not have an adverse influence on each of the setup times for other devices connected on the PCI bus 7. That is, it is important for the noise not to overlap those setup times.

Next, consider the case where in addition to the three device units 3a, 3b, and 3c, the mother device 8 is connected to the PCI bus 7. In this case, the timing margin M1' for the active connection of the device unit 3a is computed based on the following Eq. (5) so that in the PCI bus system 1, the noise caused by the active connections of each of the device units 3a, 3b, and 3c does not have an influence on the remaining device units 3 and on the mother device 8. Likewise, the timing margin M2' for the active connection of the device unit 3b is computed based on the following Eq. (6), and the timing margin M3' for the active connection of the device unit 3c is computed based on the following Eq. (7).

$$M1'=\min[\{(T+g_{12})-(a+b+c+d+e+f_{12})-S\}, \{(T+g_{13})-(a+b+c+d+e+f_{13})-S\}, \{(T+g_{1m})-(a+b+c+d+e+f_{1m})-S\}] \quad (5)$$

In Eqs. (5), (6), and (7), the reference characters T, a, b, c, d, e, g, f, and S are the same or approximately the same as the aforementioned reference characters. The equation min[a, b, c] is intended to mean that the smallest of the three (a, b, and c) is selected. The character g/m is the clock skew between the device unit 3a and the mother device 8, and $f_{1m}$ is the propagation time of noise from the device unit 3a to the mother device 8.

$$M2'=\min[\{(T+g_{21})-(a+b+c+d+e+f_{21})-S\}, \{(T+g_{23})-(a+b+c+d+e+f_{23})-S\}, \{(T+g_{2m})-(a+b+c+d+e+f_{2m})-S\}] \quad (6)$$

where $g_{2m}$ is the clock skew between the device unit 3b and the mother device 8, and $f_{2m}$ is the propagation time of noise from the device unit 3b to the mother device 8.

$$M3'=\min[\{(T+g_{31})-(a+b+c+d+e+f_{31})-S\}, \{(T+g_{32})-(a+b+c+d+e+f_{32})-S\}, \{(T+g_{3m})-(a+b+c+d+e+f_{3m})-S\}] \quad (7)$$

where $g_{3m}$ is the clock skew between the device unit 3c and the mother device 8, and $f_{3m}$ is the propagation time of noise from the device unit 3c to the mother device 8.

And the above-described parameters (the cycle "T" at the clock supply source, the clock skew "a" from the clock supply source 10 to the bus switch controller 4 that can control connection/disconnection of the bus switch 6, the control delay time "b", the signal propagation delay time "c" between the bus switch controller 4 and the bus switch 6, the operating delay time "d" of the bus switch 6, the pulse width (time) "e" of a noise, propagation delay time "f" of the noise in the device unit 3 and data bus 7a, the clock skew "g" from the clock supply source 10 to another device units 3b, 3c or another device connected to the data bus 7a, and the setup time "S" in the PCI bus system 1) are set so that each of the timing margins M1', M2', and M3' is 0 or greater.

In this way, in the PCI bus system 1 where three device units 3a, 3b, and 3c are connectable to the mother board 2 being in an active state, it is possible to easily design the PCI bys system 1 in which the noise caused by the active connections of each of the device units 3a, 3b, and 3c can be prevented from having an adverse influence on the remaining device units 3a, 3b, and 3c and the mother device 8.

In the above-described embodiment, the bus system 1 has exemplified by a PCI bus system, to which the present invention is not limited. Alternatively, the present invention is applicable to other bus systems such as an ISA (Industry Standard Architecture) bus or NuBus.

In the above-described embodiment, the PCI bus system 1 has three device units 3a, 3b, and 3c, but the present invention is not limited to the three. For example, it may have two or less device units, or four or more device units. Also, these device units 3 may differ in construction from each other.

In the above-described embodiment, the bus switch controller 4 changes a phase of the clock supplied by the clock supply source 10 to realize the control delay time b. Alternatively, the propagation delay equivalent to the control delay time b may be generated by installing a delay circuit or by adjusting the length of the circuit. The control delay time b can be realized by various modification to the above embodiment without departing the concept of the present invention.

Further in the above embodiment, the bus switch controller 4 includes the PLL circuit 41 for changing the phase of the clock signal supplied by the clock supply source 10 through the clock bus 7b, to which the present invention should by no means be limited. But the bus switch controller 4 may include a DLL (delay locked circuit) as alternative to the PLL circuit 41.

Even if the bus switch controller 4 uses a DLL circuit, the DLL circuit computes an amount of phase change of the clock such that the time between receipt of the clock signal in the bus switch controller 4 and issue of a connection instruction to the bus switch 6 from the bus switch controller 4 while the bus-switch connection condition judging circuit 42 outputs an ON signal, and the computed amount is set when the device unit 3 is about to be shipped from the factory, similarly to the case of the inclusion of the PLL circuit 41.

Now that the preferred embodiment of the present invention has been described, it will be apparent to those skilled in this art that the bus system design method, bus system, and device unit of the present invention can be easily carried out and manufactured.

INDUSTRIAL APPLICABILITY

If a bus system such as a PCI bus system is designed so that the noise caused by the active connection of a device unit has no influence on other device units and devices connected on the same bus, many active connections of device units to the same bus can be realized.

What is claimed is:

1. A design method for a bus system equipped with a plurality of device units, a data bus to which the plural device units are connectible, a timing-signal supply source supplying a timing signal to said plural device units through a timing-signal bus, a bus switch connecting and disconnecting a signal between said plural device units and said data bus, and a bus switch controller controlling connecting and disconnecting operations performed by said bus switch, comprising:

computing, for each of said plurality of device units, noise propagation timing at which, when each one of said plurality of device units is connected to said data bus being active, a noise propagates to another one or more of said plural device units or another one or more devices connected to said data bus based on a period of said timing signal, a signal propagation delay in each one of said plurality of device units, signal propagation delays in said timing-signal bus and said data bus, and a setup time in the other one or more of said plurality of device units or in the other one or more devices connected to said data bus; and computing, based on said noise propagation timing computed in said noise propagation computing, connection timing at which each one of said plural device units is to be connected to said data bus, wherein in said computing connection timing, said connection timing is computed by computing a delay time needed for said bus switch to connect each one of said plurality of device units to said data bus after each one of said plurality of device units is connected to said timing-signal bus.

2. A design method according to claim 1, wherein:

in said computing noise propagation timing, a timing margin $M\{=(T+g)-(a+b+c+d+e+f)-S\}$ between arrival of said noise at the other one or more of said plurality of device units or the one or more other devices connected to said data bus and start of said setup time is computed as propagation timing of said noise, based on the period "T" of said timing signal, skew "a" from said timing-signal supply source to said bus switch controller, a control delay time "b" between receipt of said timing signal and issue of a connection control signal for connecting each one of said plurality of device units and said data bus to said bus switch in said bus switch controller, a signal propagation delay time "c" between said bus switch controller and said bus switch, an operating delay time "d" of said bus switch, a pulse width (time) "e" of said noise, a propagation delay time "f" of said noise in each one of said plurality of device units and said data bus, skew "g" from said timing-signal supply source to the other one or more of said plurality of device units or the other one or more devices connected to said data bus, and a setup time "S" in said bus system; and in said step of connection timing computing, the control delay time "b" is computed so that said timing margin M is 0 or greater.

3. A bus system comprising:

a plurality of device units;

a data bus to which the plural device units are connectible;

a timing-signal supply source supplying a timing signal to said plural device units through a timing-signal bus;

a bus switch connecting and disconnecting a signal between said plural device units and said data bus; and a bus switch controller controlling the connecting and disconnecting operations of said bus switch by issuing, to said bus switch, a connection control signal connecting each of said plural device units and said data bus, wherein said bus switch controller controls said bus switch so that each one of said plurality of device units is connected to said data bus after a control delay time "b" between receipt of said timing signal and issue of said connection control signal to said bus switch in said bus switch controller after each one of said plurality of device units is connected to said timing-signal bus, and on the basis of the period "T" of said timing signal, skew "a" from said timing-signal supply source to said bus switch controller, the control delay time "b", a signal propagation delay time "c" between said bus switch controller and said bus switch, an operating delay time "d" of said bus switch, a pulse width (time) "e" of a noise caused when each one of said plurality of device units is connected to said data bus being active, a propagation delay time "f" of said noise in each one of said plurality of device units and said data bus, skew "g" from said timing-signal supply source to another one or more of said plural device units or another one or more devices connected to said data bus, and a setup time "S" in said bus system, the control delay time "b" is computed as a value such that a timing margin $M\{=(T+g)-(a+b+c+d+e+f)-S\}$ from arrival of said noise at the other one or more of said plurality of device units or the other one or more devices to start of said setup time is 0 or greater.

4. A bus system according to claim 3, wherein said bus switch controller includes an adjustment circuit changing a phase of said timing signal, which is supplied by said timing signal supply source through said timing-signal bus, and issues the connection control signal to said bus switch based on said timing signal whose phase has been changed.

5. A bus system according to claim 4, wherein said adjusting circuit is a PLL (phase locked loop) circuit.

6. A bus system according to claim 4, wherein said adjusting circuit is a PLL (delay locked loop) circuit.

7. A device unit installable to a bus unit equipped with a data bus, a timing-signal supply source, and a timing-signal bus connected to said timing-signal supply source, comprising:

a bus switch connecting and disconnecting a signal between said device unit and said data bus; and a bus switch controller controlling connecting and disconnecting operations of said bus switch by issuing, to said bus switch, a connection control signal connecting said device unit and said data bus, wherein said bus switch controller controls said bus switch so that said device unit is connected to said data bus after a control delay time "b" between receipt of said timing signal and issuing of the connection control signal to said bus switch in the bus switch controller after said device unit is connected to said timing-signal bus, and on the basis of a period "T" of said timing signal, skew "a" from said timing-signal supply source to said bus switch controller, the control delay time "b", a signal propagation delay time "c" between said bus switch controller and said bus switch, an operating delay time "d" of said bus switch, a pulse width (time) "e" of a noise caused when said device unit is connected to said data bus being active, a propagation delay time "f" of said noise in said device unit and said data bus, skew g from said timing-signal supply source to one or more other device units other than said device unit or one or more other devices connected to said data bus, and a setup time "S" in said bus system, the control delay time "b" of said bus switch is computed as a value such that a timing margin M{=(T+g)−(a+b+c+d+e+f)−S} from arrival of said noise at the one or more other device units or the one or more other devices to start of said setup time is 0 or greater.

8. A device unit according to claim 7, wherein said bus switch controller includes an adjustment circuit changing a pulse of said timing signal, which is supplied by said timing-signal supply source through said timing-signal bus, and issues the connection control signal to said bus switch based on said timing signal whose phase has been changed.

9. A device unit according to claim 8, wherein said adjusting circuit is a PLL (phase locked loop) circuit.

10. A device unit according to claim 8, wherein said adjusting circuit is a PLL (delay locked loop) circuit.

11. The method of claim 1, further comprising:

computing the delay time "b" so that noise from each one of the plurality of device units does not overlap the setup time of each one of the plurality of device units.

12. The bus system of claim 3, wherein the delay time "b" is computed so that noise from each of the plurality of device units does not overlap the setup time of each of the plurality of device units.

13. The device unit of claim 7, wherein the delay time "b" is computed so that noise from each of the one or more device units does not overlap the setup time of each of the one or more device units.

* * * * *

UNITED STATES PATENT AND TRADEMARK OFFICE
CERTIFICATE OF CORRECTION

PATENT NO. : 7,277,969 B2 Page 1 of 1
APPLICATION NO. : 11/317011
DATED : October 2, 2007
INVENTOR(S) : Ryohei Nishimiya It is certified that error appears in the above-identified patent and that said Letters Patent is hereby corrected as shown below:

\*     Title page, Col. 2, item (57) Abstract
        Line 11, delete "thes" and insert --the--, therefor.

Col. 17, line 13, delete "PLL" and insert --DLL--.

Col. 18, line 3, before "from said" delete "g" and insert --"g"--

Col. 18, line 21, delete "PLL" and insert --DLL--.

Signed and Sealed this

Eighteenth Day of March, 2008

JON W. DUDAS
*Director of the United States Patent and Trademark Office*